US010466320B2

(12) United States Patent
Saha et al.

(10) Patent No.: US 10,466,320 B2
(45) Date of Patent: Nov. 5, 2019

(54) MULTI-LAYERED RADIO FREQUENCY COIL

(71) Applicant: General Electric Company, Schenectady, NY (US)

(72) Inventors: Saikat Saha, Pewaukee, WI (US); Masahiro Fujimoto, Waukesha, WI (US); Micheal Edwards, Ottawa, WI (US)

(73) Assignee: General Electric Company, Schenectady, NY (US)

(*) Notice: Subject to any disclaimer, the term of this patent is extended or adjusted under 35 U.S.C. 154(b) by 105 days.

(21) Appl. No.: 15/680,166

(22) Filed: Aug. 17, 2017

(65) Prior Publication Data

US 2019/0056469 A1 Feb. 21, 2019

(51) Int. Cl.
G01R 33/34 (2006.01)
G01R 33/36 (2006.01)
G01R 33/341 (2006.01)

(52) U.S. Cl.
CPC ....... *G01R 33/3685* (2013.01); *G01R 33/341* (2013.01); *G01R 33/34007* (2013.01); *G01R 33/34046* (2013.01); *G01R 33/34076* (2013.01)

(58) Field of Classification Search
CPC .......... G01R 33/34007; G01R 33/3453; G01R 33/34046–33/34076; G01R 33/341–33/3415
USPC ...................................................... 324/322
See application file for complete search history.

(56) References Cited

U.S. PATENT DOCUMENTS

| 5,523,689 A * | 6/1996 | Oppelt | G01R 33/34046 324/318 |
| 6,396,271 B1 * | 5/2002 | Burl | G01R 33/34046 324/307 |
| 6,501,274 B1 * | 12/2002 | Ledden | G01R 33/3453 324/318 |
| 7,936,170 B2 * | 5/2011 | Saha | G01R 33/34076 324/318 |
| 8,035,384 B2 | 10/2011 | Saha | |
| 8,125,225 B2 * | 2/2012 | Koretsky | A61K 31/29 324/309 |
| 8,188,737 B2 | 5/2012 | Saha | |
| 8,487,621 B2 | 7/2013 | Saha et al. | |
| 8,704,520 B2 | 4/2014 | Saha et al. | |
| 8,742,760 B2 * | 6/2014 | Matschl | G01R 33/3415 324/318 |
| 8,779,774 B2 * | 7/2014 | Eberler | G01R 33/3657 324/307 |
| 8,884,620 B2 | 11/2014 | de Lima et al. | |
| 9,498,174 B2 | 11/2016 | Saha | |

(Continued)

Primary Examiner — Patrick Assouad
Assistant Examiner — Demetrius R Pretlow
(74) Attorney, Agent, or Firm — McCoy Russell LLP

(57) ABSTRACT

Methods and systems are provided for radio frequency (RF) coils for magnetic resonance imaging (MRI) systems. In one embodiment, a radio frequency coil for a medical imaging device comprises: a first electroconductive section having a first end and an opposing, second end; and a first plurality of notches of the first electroconductive section extending from the first end to the second end across a centerline of the first electroconductive section. In this way, an amount electrical eddy currents produced within the electroconductive surfaces of the RF coil is reduced, thereby decreasing a temperature and vibration of the RF coil.

17 Claims, 7 Drawing Sheets

(56) References Cited

U.S. PATENT DOCUMENTS

| | | | |
|---|---|---|---|
| 9,689,939 B2 | 6/2017 | Potter et al. | |
| 2002/0153893 A1* | 10/2002 | Watkins | G01R 33/34046 324/318 |
| 2004/0140808 A1* | 7/2004 | Vaughan, Jr. | G01R 33/34046 324/318 |
| 2005/0062472 A1* | 3/2005 | Bottomley | G01R 33/34046 324/317 |
| 2009/0134874 A1* | 5/2009 | Katsunuma | G01R 33/3403 324/318 |
| 2009/0302847 A1* | 12/2009 | Knizhnik | G01V 3/18 324/332 |
| 2010/0033185 A1* | 2/2010 | Saha | G01R 33/34076 324/318 |
| 2010/0117652 A1* | 5/2010 | Cork | G01R 33/3415 324/322 |
| 2013/0221968 A1* | 8/2013 | Habara | G01R 33/34046 324/322 |
| 2013/0335087 A1* | 12/2013 | Shah | G01R 33/36 324/322 |
| 2014/0097846 A1* | 4/2014 | Lemaire | G01R 33/3415 324/322 |
| 2014/0253126 A1* | 9/2014 | Habara | G01R 33/3415 324/322 |
| 2014/0253127 A1* | 9/2014 | Leussler | G01R 33/34046 324/322 |
| 2016/0091576 A1* | 3/2016 | Tomiha | G01R 33/422 324/322 |
| 2016/0334479 A1* | 11/2016 | Poole | A61B 5/0042 |
| 2018/0306877 A1* | 10/2018 | Duensing | G01R 33/3415 |

\* cited by examiner

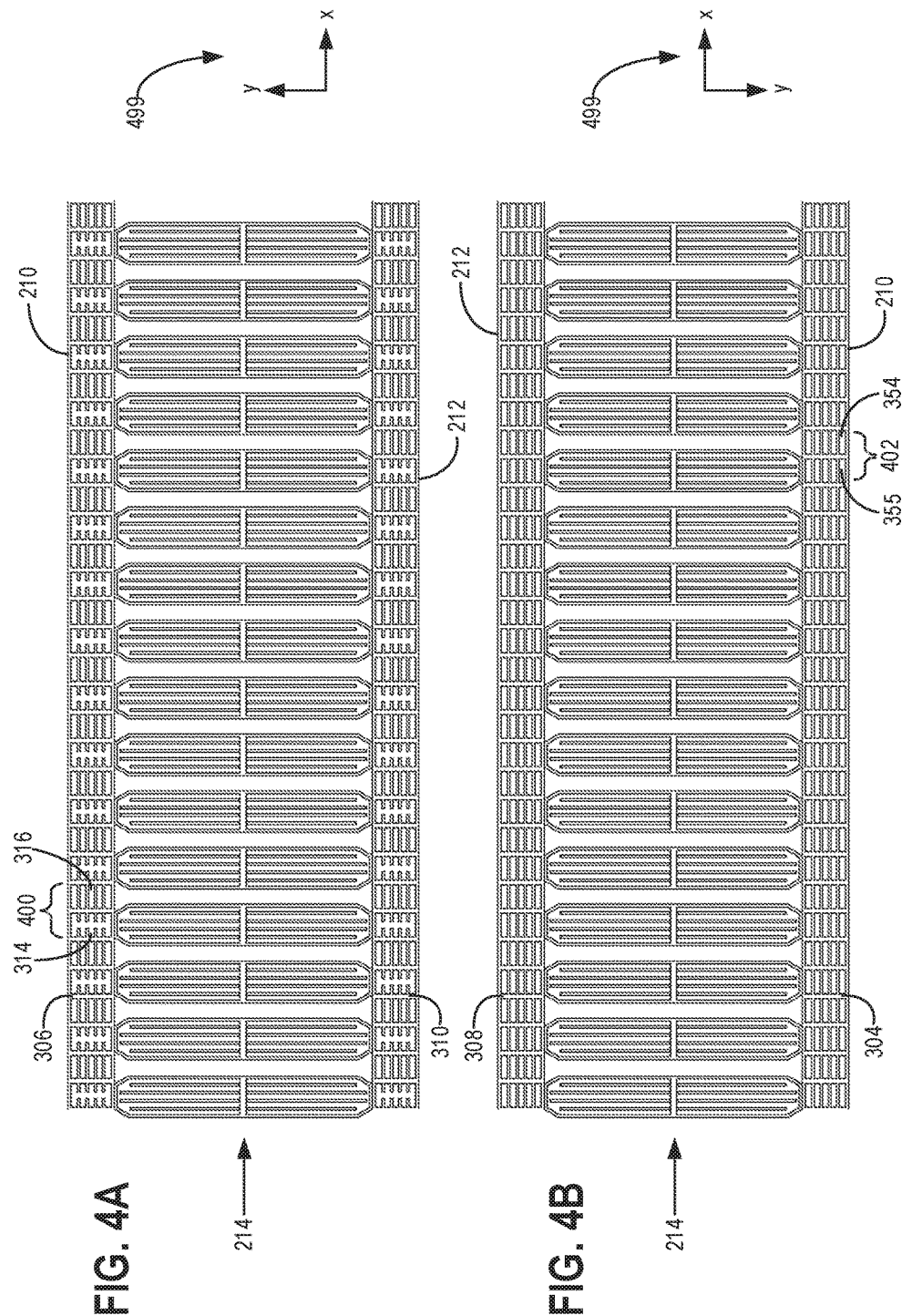

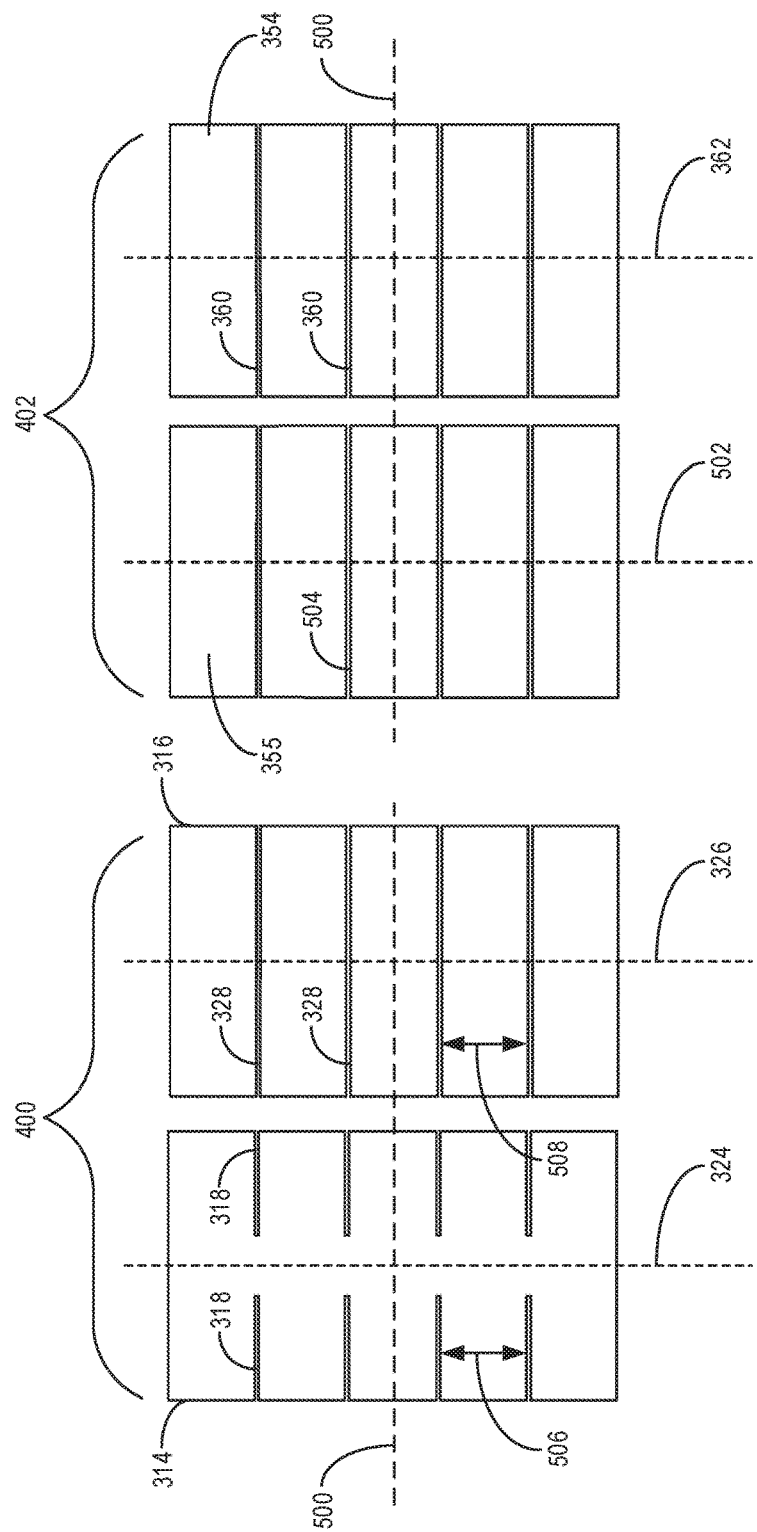

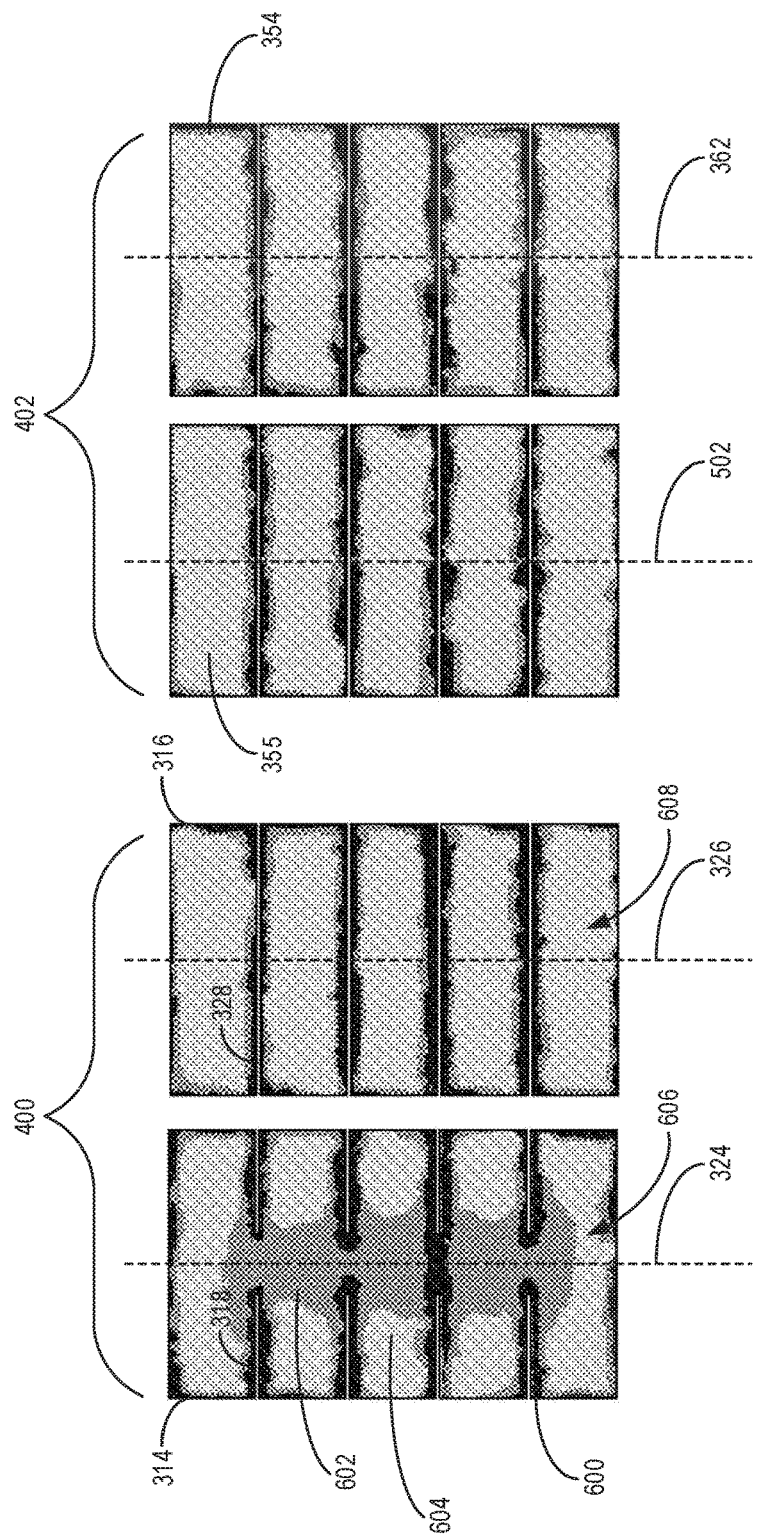

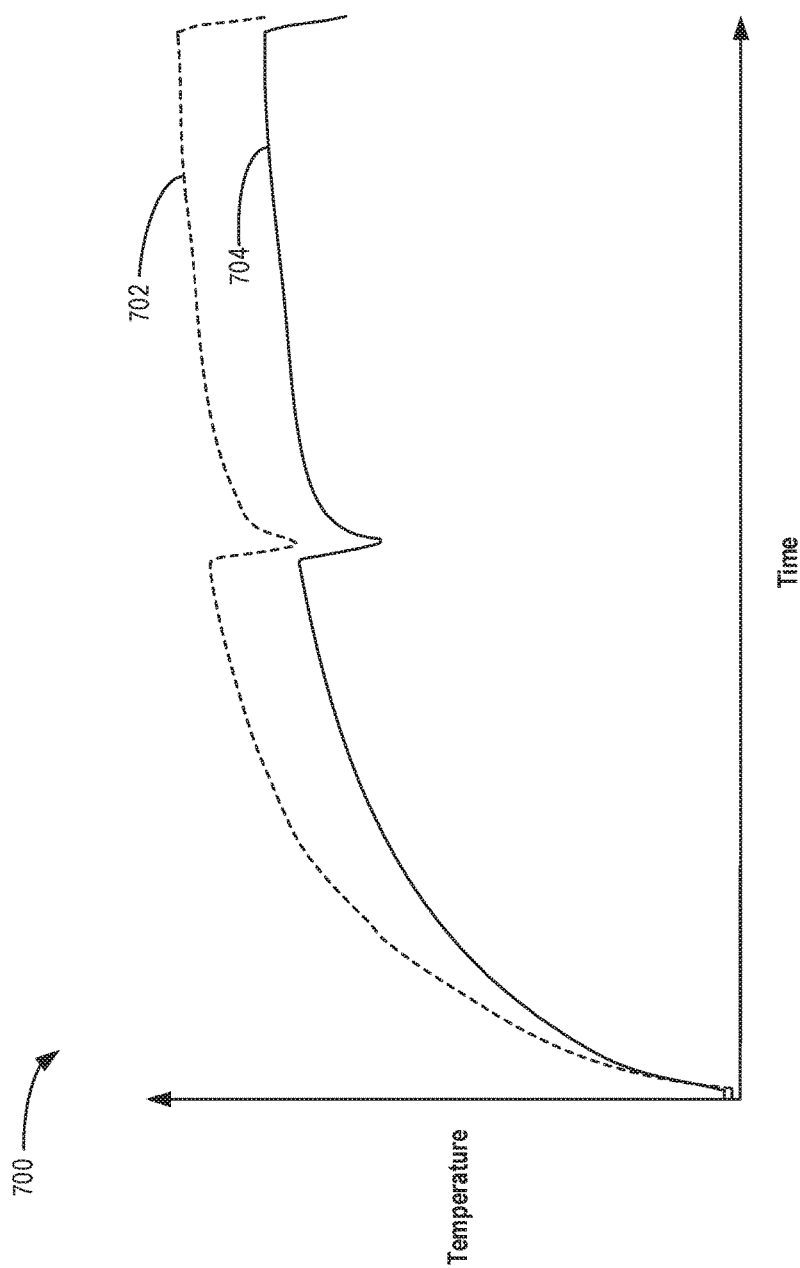

MULTI-LAYERED RADIO FREQUENCY COIL

FIELD

Embodiments of the subject matter disclosed herein relate to magnetic resonance imaging (MRI), and more particularly, to radio frequency (RF) coils for MRI systems.

BACKGROUND

Magnetic resonance imaging (MRI) is a medical imaging modality that can produce images of an interior of a patient without x-ray radiation or other types of ionizing radiation. An MRI system is a medical imaging device utilizing a superconducting magnet to create a strong, uniform, static magnetic field within a designated region (e.g., within a passage shaped to receive a patient). When a body of a patient (or portion of the body of the patient) is positioned within the magnetic field, nuclear spins associated with the hydrogen nuclei that form water within tissues of the patient become polarized. The magnetic moments associated with these spins become aligned along the direction of the magnetic field and result in a small net tissue magnetization in the direction of the magnetic field. MRI systems additionally include magnetic gradient coils that produce spatially-varying magnetic fields of smaller magnitudes relative to a magnitude of the uniform magnetic field resulting from the superconducting magnet. The spatially-varying magnetic fields are configured to be orthogonal to each other in order to spatially encode the region by creating a signature resonance frequency of the hydrogen nuclei at different locations in the body of the patient. Radio frequency (RF) coil assemblies are then used to create pulses of RF energy at or near the resonance frequency of the hydrogen nuclei. The pulses of RF energy are absorbed by the hydrogen nuclei, thereby adding energy to the nuclear spin system and adjusting the hydrogen nuclei from a rest state to an excited state. As the hydrogen nuclei relax back to the rest state from the excited state, they release the absorbed energy in the form of an RF signal. This signal is detected by the MRI system and is transformed into an image by a computer using known reconstruction algorithms.

BRIEF DESCRIPTION

In one embodiment, a radio frequency (RF) coil for a medical imaging device comprises: a first electroconductive section having a first end and an opposing, second end; and a first plurality of notches of the first electroconductive section extending from the first end to the second end across a centerline of the first electroconductive section. In this way, the plurality of notches reduces an amount of electrical eddy current flowing through the first electroconductive segment and decreases an operating temperature of the RF coil during imaging of a patient.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below:

FIG. 4A shows a flattened view of an exterior of the RF coil of FIG. 2, and FIG. 4B shows a flattened view of an interior of the RF coil of FIG. 2, according to an embodiment;

FIG. 5A shows an enlarged view of electroconductive sections positioned at the exterior of the RF coil of FIG. 2, and FIG. 5B shows an enlarged view of electroconductive sections positioned at the interior of the RF coil FIG. 2, according to an embodiment;

FIG. 6A shows relative temperatures of the electroconductive sections shown by FIG. 5A, and FIG. 6B shows relative temperatures of the electroconductive sections shown by FIG. 5B, according to an embodiment; and FIG. 7 shows a graph illustrating temperatures of the bore of FIG. 2 during operation of the RF coil of FIG. 2, according to an embodiment.

FIGS. 2-6B are shown approximately to scale, though other relative dimensions may be used.

DETAILED DESCRIPTION

The following description relates to various embodiments of magnetic resonance imaging (MRI). In particular, systems and methods are provided for a radio frequency (RF) coil for an MRI system. An MRI system, such as the MRI system shown by FIG. 1, includes a gantry having a bore with an imaging space positioned therein. An RF coil including two opposing end rings and a plurality of rungs is coupled around a perimeter of the bore in order to image a patient positioned within the imaging space. The RF coil, as shown by FIGS. 3-5B, includes a plurality of electroconductive sections coupled to interior and exterior surfaces of the end rings. Each electroconductive section includes a plurality of notches extending in a transverse direction relative to a centerline of the electroconductive section, as shown by FIGS. 5A-5B. The notches of each electroconductive section reduces an amount of eddy currents within the electroconductive sections during operation of the MRI system. The reduction of eddy currents decreases a temperature of the electroconductive sections, as shown by FIGS. 6A-6B, and may reduce an amount of vibration of the RF coil. The reduced temperature of the electroconductive sections results in a decreased temperature of the bore of the gantry, as shown by FIG. 7. The reduced temperatures and vibrations due to the reduced eddy currents may result in increased patient comfort and a decreased amount of electrical power consumption of the RF coil.

Though an MRI system is described by way of example, it should be understood that the present techniques may also be useful when applied to images acquired using other imaging modalities, such as tomosynthesis, computed tomography, C-arm angiography, and so forth. The present discussion of an MRI imaging modality is provided merely as an example of one suitable imaging modality.

Figure 1:
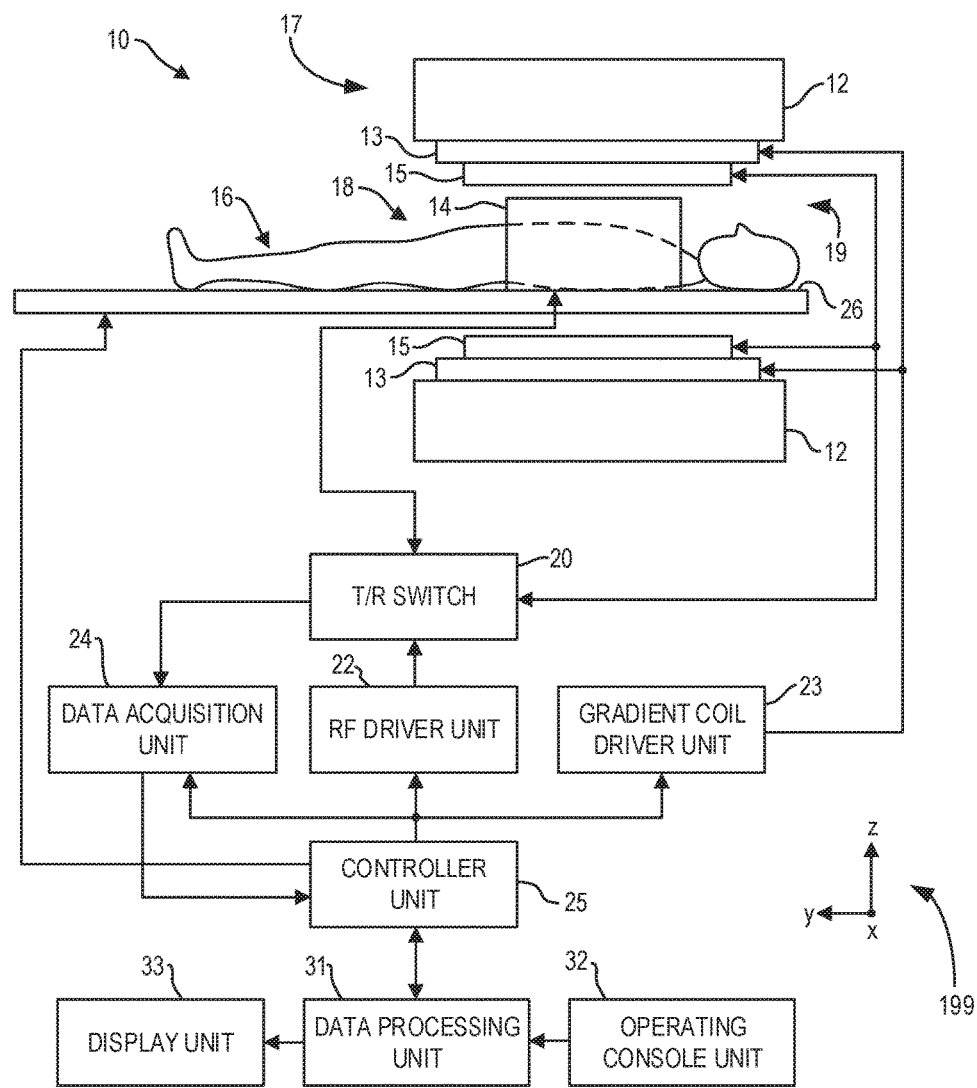
FIG. 1 shows a schematic diagram of an example magnetic resonance imaging (MRI) system including a radio frequency (RF) coil, according to an embodiment.

FIG. 1 illustrates an MRI system 10 that includes a magnetostatic field magnet unit 12 (e.g., a superconducting magnet), a magnetic gradient generator 13, local RF coils 14, volumetric RF coils 15 (which may be referred to herein as body RF coils), a transmit/receive (T/R) switch 20, an RF signal driver 22, a gradient driver 23, a data acquisition unit 24, a controller unit 25, a patient table 26 (which may be referred to herein as a bed), a data processing unit 31, an operating console unit 32, and a display unit 33. The local RF coils 14 are surface coils configured to be placed proximate to surfaces of an anatomical structure of a subject 16 (e.g., a patient) to be scanned by the MRI system 10. The volumetric RF coils 15 are coils configured to transmit RF signals (e.g., electromagnetic waves at radio frequencies), and the local RF coils 14 are configured to receive RF signals. As such, the volumetric RF coils 15 and the local RF coils 14 are spatially separated from each other but may be electromagnetically coupled to each other. In some examples, the local RF coils 14 and/or volumetric RF coils 15 may both transmit and receive RF signals. Example operational modes of the coils (e.g., local RF coils 14 and volumetric RF coils 15) are described further below.

The MRI system 10 includes the patient table 26 for placing a subject 16 (e.g., a patient) thereon. The subject 16 may be moved inside and outside of an imaging space 18 by moving the patient table 26. The imaging space 18 may be positioned within a bore 19 of a gantry 17 of the MRI system 10. In some examples, controller unit 25 may transmit control signals (e.g., electrical signals) to operating console unit 32 and/or display unit 33 in order to indicate a position of the patient table 26 within the imaging space 18 to an operator (e.g., user, technician, etc.) of the MRI system 10.

The operating console unit 32 includes user input devices such as a keyboard and a mouse. The operating console unit 32 is utilized by an operator, for example, to input an imaging protocol (e.g., a parallel imaging protocol) and to set a region where an imaging sequence is to be executed. Data input by the operator into the operating console unit 32 about the imaging protocol and the imaging sequence execution region is output to the controller unit 25.

The display unit 33 includes a graphical display device (e.g., computer screen) and displays an image on the graphical display device based on control signals received from the controller unit 25. The display unit 33 displays, for example, an image regarding an input item about which the operator inputs operation data from the operating console unit 32. The display unit 33 also displays a slice image of the subject 16 generated by the data processing unit 31.

The data processing unit 31 includes a computer and a recording medium (e.g., hard drive) on which a program to be executed by the computer to perform predetermined data processing is recorded. The data processing unit 31 is electrically coupled with the controller unit 25 and performs data processing based on control signals received from the controller unit 25. The data processing unit 31 is also connected to the data acquisition unit 24 and generates spectrum data by applying various image processing operations to magnetic resonance (MR) signals output from the data acquisition unit 24 (described in further detail below).

The magnetostatic field magnet unit 12 includes an annular superconducting electromagnet coupled to a toroidal vacuum vessel (e.g., gantry 17) and positioned within an interior of the toroidal vacuum vessel. The electromagnet defines a cylindrical space (e.g., bore 19) surrounding the subject 16, and generates a magnetostatic field of approximately constant magnitude and direction within the cylinder space (e.g., in a direction of the y-axis within the cylinder space as shown by reference axes 199). The magnetostatic field generated by the electromagnet may be referred to herein as a uniform magnetic field.

The MRI system 10 also includes the magnetic gradient generator 13 that generates an additional magnetic field (which may be referred to herein as a gradient magnetic field) in the imaging space 18 so as to associate the MR signals received by the local RF coils 14 with three-dimensional positional information. For example, the gradient magnetic field produced by the magnetic gradient generator 13 may have a different magnitude (e.g., a different field strength) at different locations within the imaging space 18. The magnetic gradient generator 13 includes three gradient coil systems. Each gradient coil system adjusts the magnitude of the gradient magnetic field along one of three perpendicular directions. For example, a first gradient coil system adjusts the magnitude of the gradient magnetic field in a frequency encoding direction, a second gradient coil system adjusts the magnitude of the gradient magnetic field in a phase encoding direction, and a third gradient coil system adjusts the magnitude of the gradient magnetic field in a slice selection direction. The frequency encoding direction, phase encoding direction, and slice selection direction may be defined based on input from a user (e.g., operator) of the MRI system 10 (e.g., via the operating console unit 32). More specifically, the magnetic gradient generator 13 adjusts the magnitude of the gradient magnetic field in the slice selection direction of the subject 16 in response to input from the operator. The local RF coils 14 then transmits an RF pulse to a selected slice of the subject 16 and energizes the slice (e.g., excites a spin of hydrogen nuclei within the selected slice of the subject 16). The magnetic gradient generator 13 adjusts the magnitude of the gradient magnetic field in the phase encoding direction of the subject 16 to phase encode MR signals emitted by the slice energized by the RF pulse. The magnetic gradient generator 13 then adjusts the magnitude of the gradient magnetic field in the frequency encoding direction of the subject 16 to frequency encode MR signals emitted by the slice excited by the RF pulse.

The gradient driver 23 drives the magnetic gradient generator 13 based on a control signal received from the controller unit 25 and thereby generates the gradient magnetic field in the imaging space 18. The gradient driver 23 includes three systems of driver circuits (not shown) corresponding to the three gradient coil systems included in the magnetic gradient generator 13 (as described above).

The RF coils of the MRI system 10 (e.g., local RF coils 14 and/or volumetric RF coils 15) may transmit electromagnetic pulse signals to the subject 16 positioned within the imaging space 18, with the uniform magnetic field and the gradient magnetic field extending through the imaging space 18. The local RF coils 14 are shaped, for example, to enclose the region of the subject 16 to be imaged. In some examples, the local RF coils 14 may be referred to as surface coils or receiver coils. The MRI system 10 receives MR signals from the subject 16 (e.g., via the data acquisition unit 24 coupled to the RF coils) and processes the MR signals (e.g., via the data processing unit 31) in order to construct an image of a slice of the subject 16 based on the received MR signals.

For example, during conditions in which the subject 16 is positioned to be scanned by the MRI system 10 (e.g., during conditions in which the subject 16 is within the imaging space 18), spins of hydrogen nuclei within the tissues of the subject 16 may be aligned with initial magnetization vectors resulting from a combination of the uniform magnetic field and the gradient magnetic field. The local RF coils 14 may transmit, based on a control signal from the controller unit 25, an RF pulse that is an electromagnetic wave to the subject 16. The RF pulses transmitted to the subject 16 generate a high-frequency magnetic field within the slice of the subject 16 to be imaged (e.g., as selected by the operator of the MRI system 10). The high-frequency magnetic field excites a spin of hydrogen nuclei in the slice of the subject 16 and aligns the spins with different magnetization vectors relative to the initial magnetization vectors. As the spins of the excited hydrogen nuclei in the slice of the subject 16 relax and return into alignment with the initial magnetization vectors, the local RF coils 14 receive electromagnetic waves generated from the tissues of the subject 16 as a MR signals.

The volumetric RF coils 15 may alternately (or additionally) be utilized to generate a high-frequency magnetic field similar to that described above with reference to the local RF coils 14. For example, the volumetric RF coils 15 are positioned to enclose the imaging space 18 and may produce RF pulses in a direction orthogonal to the direction of the uniform magnetic field generated by the magnetostatic field magnet unit 12 within the imaging space 18 in order to excite the hydrogen nuclei of the subject 16. The volumetric RF coils 15 are fixedly attached and coupled to the MRI system 10, unlike the local RF coils 14 which may be disconnected from the MRI system 10 and replaced with different local RF coils. Furthermore, whereas local coils such as those comprising the local RF coils 14 may transmit to and/or receive signals (e.g., transmit RF signals and/or receive MR signals) from a localized region of the subject 16 (e.g., a particular anatomical structure or slice of the subject 16), the volumetric RF coils 15 may transmit to and/or receive signals from a larger portion of the subject 16 (e.g., an entire body of the subject 16).

The RF signal driver 22 electrically coupled to the coils (e.g., volumetric RF coils 15 and/or local RF coils 14) via the T/R switch 20 includes a gate modulator (not shown), an RF power amplifier (not shown), and an RF oscillator (not shown) that are used to drive the local RF coils 14 and/or volumetric RF coils 15 to form a high-frequency magnetic field in the imaging space 18 (as described above). The RF signal driver 22 modulates the RF signal received from the RF oscillator into a signal of predetermined timing and having a predetermined envelope via the gate modulator, with the RF signal based on a control signal from the controller unit 25. The RF signal modulated by the gate modulator is amplified by the RF power amplifier and then output to the local RF coils 14 and/or volumetric RF coils 15.

The T/R switch 20 can selectively electrically couple the local RF coils 14 and/or the volumetric RF coils 15 to the data acquisition unit 24 when operating in a receive mode, and to the RF signal driver 22 when operating in a transmit mode. During conditions in which the local RF coils 14 and the volumetric RF coils 15 are both used in a single scan (e.g., during conditions in which the local RF coils 14 are configured to receive MR signals and the volumetric RF coils 15 are configured to transmit RF signals), the T/R switch 20 may direct control signals from the RF signal driver 22 to the volumetric RF coils 15 while directing received MR signals from the local RF coils 14 to the data acquisition unit 24. As described above, the volumetric RF coils 15 may be configured to operate in a transmit-only mode, a receive-only mode, or a transmit-and-receive mode. The local RF coils 14 may be configured to operate in a transmit-and-receive mode or a receive-only mode.

The data acquisition unit 24 includes a preamplifier (not shown), a phase detector (not shown), and an analog/digital converter (not shown) used to acquire the magnetic resonance signals received by the local RF coils 14 and/or volumetric RF coils 15. In the data acquisition unit 24, the phase detector phase detects, using the output from the RF oscillator of the RF signal driver 22 as a reference signal, the MR signals received by the local RF coils 14 and/or volumetric RF coils 15 (with the MR signals being amplified by the preamplifier), and outputs the phase-detected analog MR signals to the analog/digital converter for conversion into digital signals. The digital signals thus obtained are output to the data processing unit 31 electrically coupled with the controller unit 25.

The controller unit 25 includes a computer and a recording medium on which a program to be executed by the computer is recorded. The program when executed by the computer causes various parts of the system to carry out operations corresponding to pre-determined scanning. The recording medium may comprise, for example, a read-only memory (ROM), flexible disk, hard disk, optical disk, magneto-optical disk, CD-ROM, or non-volatile memory card. The controller unit 25 is connected to the operating console unit 32 and processes the operation signals input to the operating console unit 32 (e.g., input by the operator of the MRI system 10) and furthermore controls the patient table 26, RF signal driver 22, gradient driver 23, and data acquisition unit 24 by outputting control signals to them. The controller unit 25 also controls, to obtain a desired image, the data processing unit 31 and the display unit 33 based on operation signals received from the operating console unit 32.

During a scan (e.g., imaging of the subject 16 according to the examples described above), coil-interfacing cables (not shown) may be used to transmit signals between the RF coils (e.g., local RF coils 14 and volumetric RF coils 15) and other aspects of the processing system (e.g., data acquisition unit 24, controller unit 25, and so on), for example to control the RF coils and/or to receive information from the RF coils. As explained previously, in one example the volumetric RF coils 15 may transmit RF signals and the local RF coils 14 may receive MR signals. The local RF coils 14 and/or volumetric RF coils 15 may include coils that are used to transmit RF excitation signals ("transmitter coil") and coils that receive the MR signals emitted by an imaging subject ("receive coil"). In some examples, the transmitter coils and receive coils may be the same coils (e.g., configured to both transmit RF excitation signals and receive MR signals) such that the coils are a single mechanical structure or array of structures, with the transmit/receive modes of the coils switchable by auxiliary circuitry (e.g., T/R switch 20). In other examples, the volumetric RF coils 15 and local RF coils 14 may be independent structures that are physically coupled to each other via a data acquisition unit or other processing unit.

In some examples (e.g., examples in which the transmitter coils and receive coils are not the same coils), it may be desirable to configure the receive coils to be mechanically and electrically isolated from the transmitter coils in order to achieve an increased image quality. In one example, the receive coils (e.g., local RF coils 14) may be configured to receive MR signals for a duration following transmission of RF signals from the transmitter coils (e.g., volumetric RF coils 15). However, for the duration in which the transmitter coils are transmitting RF signals, it may be desirable to electromagnetically decouple the receive coils from the transmitter coils such that the receive coils are not resonant with the transmitter coils (e.g., such that the receive coils do not receive the RF signals from the transmitter coils). Electromechanically decoupling (e.g., deactivating) the receive coils during transmission of RF signals by the transmitter coils may reduce an amount of noise produced within auxiliary circuitry coupled to the receive coils and may result in increased image quality.

In some examples (as described below with reference to FIGS. 2-6), the volumetric RF coils 15 may be positioned in a birdcage arrangement (which may be referred to herein as a birdcage coil assembly) coupled to an exterior surface of the bore 19 of gantry 17 and surrounding the imaging space 18.

Figure 2:
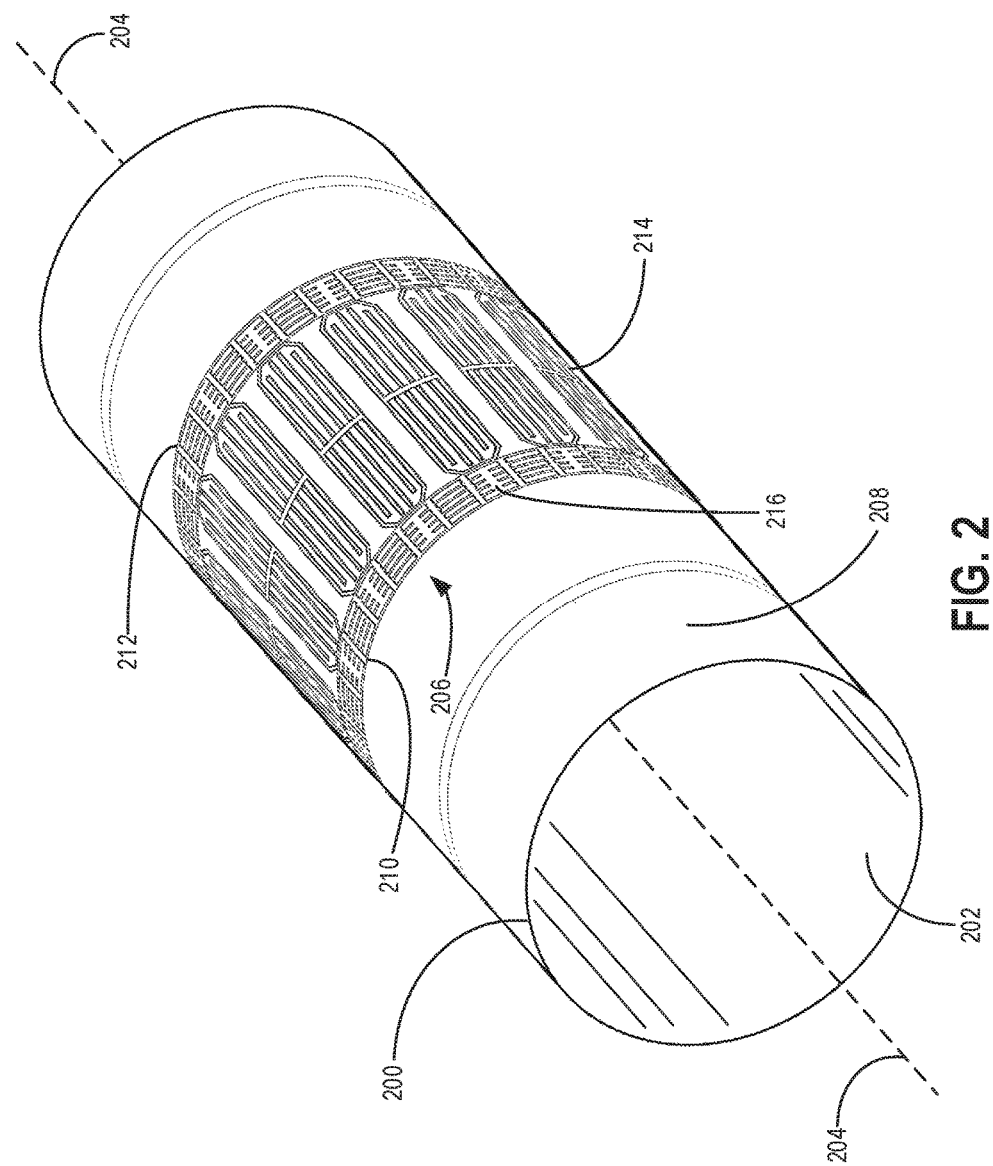
FIG. 2 shows a perspective view of a bore of a gantry of an MRI system including an RF coil having sectioned end rings, according to an embodiment.

FIG. 2 shows a bore 200 of a gantry of an MRI system including an RF coil 206 (similar to bore 19 of gantry 17 of MRI system 10 shown by FIG. 1 and described above). An imaging space is formed within an interior 202 of the bore 200 for imaging of a subject (e.g., a patient positioned on a table, such as table 26 shown by FIG. 1 and described above). In the example shown by FIG. 2, bore 200 is cylindrical in shape with a central axis 204. In other examples, the bore 200 may have a different shape (e.g., shaped with a rectangular cross-section).

The RF coil 206 is a volumetric RF coil similar to volumetric coils 15 shown by FIG. 1 and described above. The RF coil 206 is coupled to an exterior surface 208 of the bore 200 circumferentially around the central axis 204 and includes a first end ring 210 and a second end ring 212 coupled together via a plurality of rungs 214 (which may be referred to herein as legs). The first end ring 210 and second end ring 212 are annular rings shaped to surround a perimeter of the bore 200 in order to image a patient within the interior 202 (e.g., imaged as described above with reference to FIG. 1). Each of the first end ring 210 and second end ring 212 may be formed from a material that is not electrically conductive (e.g., an electrical insulator) and include a plurality of electroconductive sections 216. In one example, the first end ring 210 and second end ring 212 may be formed of a glass-reinforced epoxy, and the electroconductive sections may be layers of copper directly bonded to the surfaces of the end rings (e.g., adhered directly to the surfaces with no other components positioned therebetween). In other examples, the end rings may be formed of a different material (e.g., silica) and/or the electroconductive sections may be formed of a differently electrically conductive material (e.g., gold, platinum, etc.). For example, the end rings may each include one or more printed circuit boards, with the electroconductive sections being layers of copper permanently adhered to the surfaces of the circuit boards. Each electrically conductive section includes a plurality of notches positioned to reduce an amount of eddy currents within the conductive sections as shown in further detail by first inset 300 and second inset 302 of FIG. 3.

Figure 3:
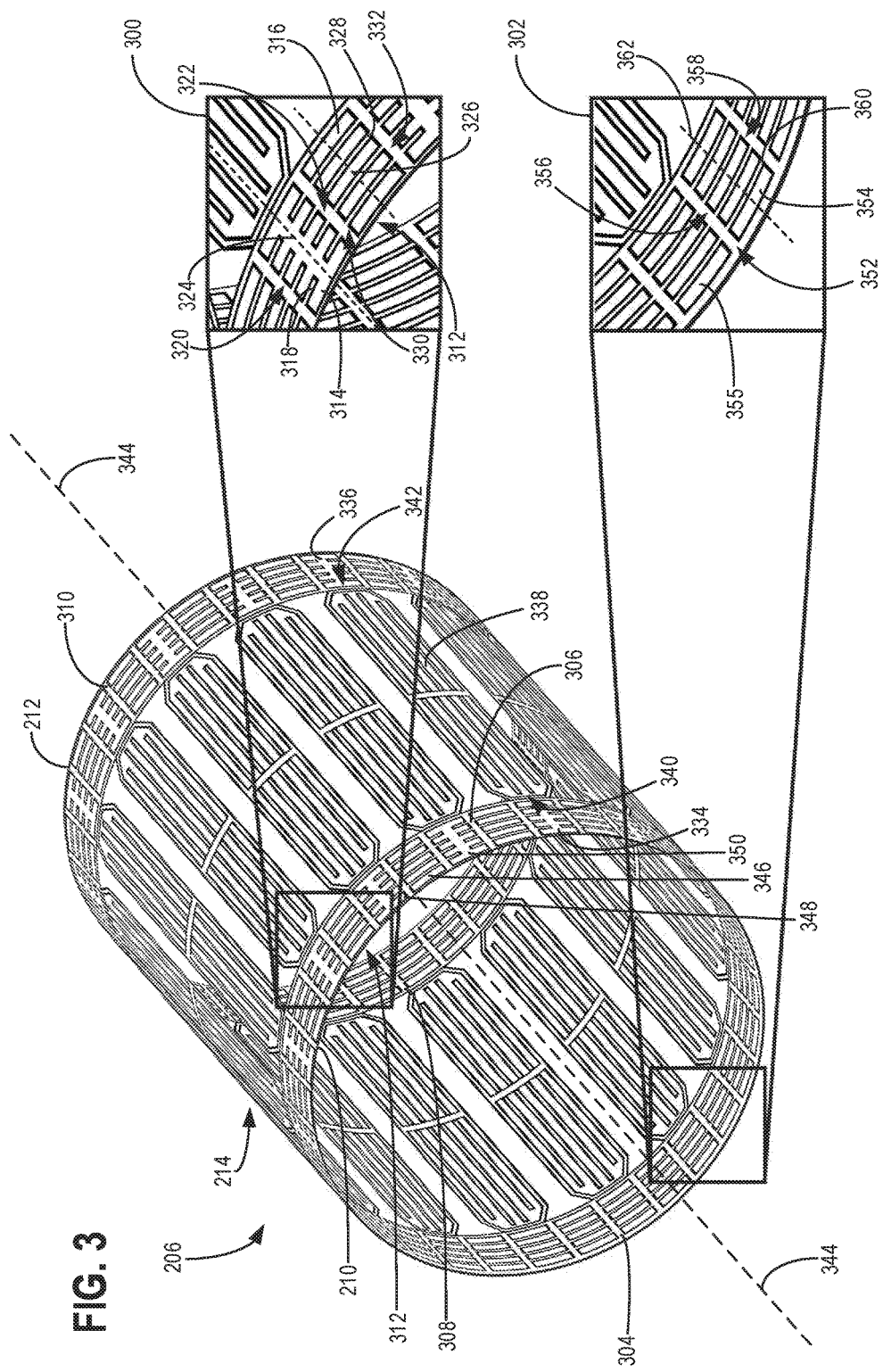
FIG. 3 shows a front perspective view of the RF coil of FIG. 2, according to an embodiment.

FIG. 3 illustrates a perspective view of the RF coil 206 decoupled from the exterior surface 208 of the bore 200 of the MRI system. The first end ring 210 and second end ring 212 of the RF coil 206 each include a first surface and an opposing, second surface (which may be referred to herein as an outer surface and inner surface, respectively). For example, the first end ring 210 includes inner surface 304 and outer surface 306, and the second end ring 212 includes inner surface 308 and outer surface 310. Although the first end ring 210 is described below as an example, the second end ring 212 is configured similarly relative to the first end ring 210.

The first end ring 210 includes a first plurality of electroconductive sections 312 (which may be referred to herein as outer sections) positioned along the outer surface 306. As described above, each electroconductive section of the outer sections 312 may be formed of a conductive metal (e.g., copper) directly bonded to the outer surface 306 of the first end ring 210. As shown by first inset 300, the outer sections 312 include a first electroconductive section 314 having a first configuration and a second electroconductive section 316 having a second configuration. Specifically, the first electroconductive section 314 includes a plurality of notches 318 extending from a first end 320 and a second end 322 of the first electroconductive section 314 toward a centerline 324 of the first electroconductive section 314 in a transverse direction relative to the centerline 324. However, the notches 318 do not extend across the centerline 324 of the first electroconductive section 314. The second electroconductive section 316 includes a plurality of notches 328 extending from a first end 330 of the second electroconductive section 316 to a second end 332 of the second electroconductive section 316 and across a centerline 326 of the second electroconductive section 316 in a transverse direction relative to the centerline 326. The shapes of the first electroconductive section 314 and second electroconductive section 316 are shown in further detail by FIGS. 5A-5B and described below.

The outer sections 312 include a plurality of electroconductive sections similar to (e.g., having a same shape as) the first electroconductive section 314 and second electroconductive section 316 described above, with the sections similar to the first electroconductive section 314 being positioned in an alternating arrangement with the sections similar to the second electroconductive section 316 along an entire perimeter of the outer surface 306. Each section similar to the first electroconductive section 314 is positioned between two corresponding sections similar to the second electroconductive section 316. Said another way, each section similar to the first electroconductive section 314 is positioned such that a section similar to the second electroconductive section 316 is located adjacent to the first end 320 and another section similar to the second electroconductive section 316 is located adjacent to the second end 322. This arrangement repeats along an entire circumference of the outer surface 306 such that no two sections similar to the first electroconductive section 314 are positioned adjacent to each other along the outer surface 306. Similar, no two sections similar to the second electroconductive section 316 are positioned adjacent to each other along the outer surface 306. In this arrangement, a number of sections included by the outer sections 312 similar to the first electroconductive section 314 is the same as a number of sections included by the outer sections 312 similar to the second electroconductive section 316. For example, the outer sections 312 may include sixteen sections similar to the first electroconductive section 314 (including the first electroconductive section 314) and sixteen sections similar to the second electroconductive section 316 (including the second electroconductive section 316), with each section similar to the first electroconductive section 314 being adjacent to two corresponding sections similar to the second electroconductive section 316. In other examples, the outer sections 312 may include a different number of sections (e.g., thirty-two sections similar to the first electroconductive section 314 and thirty-two sections similar to the second electroconductive section 316).

In the alternating arrangement described above, each section similar to the first electroconductive section 314 is positioned at a corresponding rung of the plurality of rungs 214. For example, electroconductive section 334 positioned at the outer surface 306 of the first end ring 210 is positioned at a first end 340 of rung 338, and electroconductive section 336 positioned at the outer surface 310 of the second end ring 212 is positioned at a second end 342 of the rung 338, with the first end 340 being opposite to the second end 342 in a direction of a central axis 344 of the RF coil 206, and with the rung 338 extending between the electroconductive section 334 and the electroconductive section 336 in a direction parallel to the central axis 344 (e.g., between the first end ring 210 and the second end ring 212). The electroconductive section 334 of the outer surface 306 of the first end ring 210 is mechanically and electrically coupled (e.g., soldered, fused, etc.) to the rung 338 at the first end 340, and the electroconductive section 336 of the outer surface 310 of the second end ring 212 is similarly mechanically and electrically coupled to the rung 338 at the second end 342. In this configuration, electrical current may flow between the electroconductive section 334 of the first end ring 210 and the electroconductive section 336 of the second end ring 212 via the rung 338. Although the electroconductive section 334 and electroconductive section 336 are described above coupled to the rung 338 as an example, each section of the first end ring 210 similar to the first electroconductive section 314 is similarly coupled to a corresponding section of the second end ring 212 (with the corresponding section being similar to the first electroconductive section 314) by a corresponding rung of the plurality of rungs 214.

No sections similar to the second electroconductive section 316 at the outer surface 306 or outer surface 310 are directly coupled to the plurality of rungs 214. However, each section similar to the second electroconductive section 316 is mechanically and electrically coupled to each adjacent electroconductive section. For example, electroconductive section 346 (similar to second electroconductive section 316) is mechanically and electrically coupled to adjacent electroconductive sections 348 and 348 (each similar to first electroconductive section 314) along the outer surface 306 of the first end ring 210. In this configuration, the electroconductive sections at the outer surface 306 of the first end ring 210 are electrically coupled to each other such that electrical current may flow through each section (e.g., during conditions in which the MRI system is operated to image a patient, as described above with reference to FIG. 1).

The first end ring 210 additionally includes a second plurality of electroconductive sections 352 (which may be referred to herein as inner sections) positioned along the inner surface 304. As described above (and similar to the outer sections 312), each electroconductive section of the inner sections 352 may be formed of a conductive metal (e.g., copper) directly bonded to the inner surface 304 of the first end ring 210. As shown by second inset 302, each electroconductive section of the inner sections 352 has a shape similar to the second electroconductive section 316 described above. For example, electroconductive section 354 includes a plurality of notches 360 extending from a first end 320 to a second end 322 across a centerline 362 of the electroconductive section 354 in a transverse direction relative to the centerline 362.

Although the electroconductive sections positioned at the outer surface 306 are positioned in an alternating arrangement as described above, the electroconductive sections positioned at the inner surface 304 do not have an alternating arrangement. Each electroconductive section of the inner sections 352 is shaped in a same way relative to each other electroconductive section of the inner sections 352 (e.g., similar to second electroconductive section 316). Each electroconductive section of the inner sections 352 is electrically and mechanically coupled (e.g., soldered, fused, etc.) with each adjacent electroconductive section of the inner sections 352 such that electrical current may flow through each section (e.g., during conditions in which the MRI system is operated to image a patient, as described above with reference to FIG. 1). Additionally, one or more of the electroconductive sections of the inner sections 352 may be electrically coupled with one or more electroconductive sections of the outer sections 312 so that electrical current may flow to the sections positioned at both the inner surface 304 and the outer surface 306. Although the configuration (e.g., shape, position, etc.) of the electroconductive sections of the first end ring 210 are described above as an example, the second end ring 212 includes a similar configuration.

By shaping the electroconductive sections at the inner surface 304 and inner surface 308 to include notches that extend across the centerline of each electroconductive section, an amount of eddy currents within each electroconductive section may be reduced. For example, during operation of the MRI system, a temperature of the bore 200 (shown by FIG. 2) may become increased due to electrical eddy currents generated in the electroconductive sections of the first end ring 210 and second end ring 212. The electrical eddy currents result from interactions between a magnetic field generated by a gradient coil (e.g., magnetic gradient generator 13 described above with reference to FIG. 1) and the electroconductive sections of the end rings. The electrical eddy currents, in combination with a static magnetic field (e.g., B0 field, as produced by a magnetostatic field magnet unit, such as magnetostatic field magnet unit 12 described above), may additionally result in vibration of the RF coil 206 causing increased levels of acoustic noise within the interior 202 of the bore 200. By increasing the number of electroconductive sections which include notches, the electrical eddy currents are disrupted, resulting in a decreased temperature of the bore 200 and/or a decreased amount of acoustic noise within the interior 202. In particular, increasing a number of electroconductive sections which include notches extending across the centerline of each section relative to a number of electroconductive sections which include notches that do not extend across the centerline of each section further reduces the generation of electrical eddy currents.

FIGS. 4A-4B each show a flattened view of different sides of the RF coil 206. The views shown by FIGS. 4A-4B are included for illustrative purposes to indicate a relative position, number, and arrangement of the electroconductive sections of the inner sections 352 and outer sections 312. For example, FIG. 4A shows a flattened view of an exterior of the RF coil 206 (e.g., a side of the RF coil 206 including the outer sections 312 positioned away from the exterior surface 208 of the bore 200 during conditions in which the RF coil 206 is coupled to the bore 200), and FIG. 4B shows a flattened view of an interior of the RF coil 206 (e.g., a side of the RF coil 206 including the inner sections 352 and positioned in face-sharing contact with the exterior surface 208 of the bore 200 during conditions in which the RF coil 206 is coupled to the bore 200). Reference axes 499 are included for comparison of the views shown by FIGS. 4A-4B.

As shown by FIGS. 4A-4B, configuring the inner sections 352 to include only electroconductive sections that have notches extending across the centerline of each section increases the number of electroconductive sections of the RF coil 206 that are similar to the second electroconductive section 316 relative to the number of electroconductive sections that are similar to the first electroconductive section 314. Because the second electroconductive section 316 includes notches 328 extending across the centerline 326, an amount of electrical eddy currents within the second electroconductive section 316 during operation of the RF coil 206 is reduced relative to the first electroconductive section 314. Similarly, because the RF coil 206 includes a greater number of electroconductive sections similar to the second electroconductive section 316 relative to sections similar to the first electroconductive section 314, a number and/or magnitude of eddy currents within the RF coil 206 is reduced, thereby reducing a temperature and vibration of the RF coil 206.

Bracket 400 shown by FIG. 4A illustrates a position of the first electroconductive section 314 and second electroconductive section 316 at the outer surface 306, and bracket 402 shown by FIG. 4B illustrates a position of the electroconductive section 354 and adjacent, similar electroconductive section 355 at the inner surface 308, as shown by FIG. 3. The first electroconductive section 314, second electroconductive section 316, electroconductive section 354, and electroconductive section 355 are each shown in greater detail by FIGS. 5A-5B.

FIGS. 5A-5B show an axis 500 positioned parallel to the central axis 344 of the RF coil 206 shown by FIG. 3. As shown, the axis 500 extends in a direction parallel to each of the notches (e.g., notches 318 of first electroconductive section 314, notches 328 of second electroconductive section 316, notches 504 of electroconductive section 355, and notches 360 of electroconductive section 354). The axis 500 (and central axis 344) extends in a transverse direction relative to each centerline of each electroconductive section (e.g., centerline 324 of first electroconductive section 314, centerline 326 of second electroconductive section 316, centerline 362 of electroconductive section 354, and centerline 502 of electroconductive section 355). In the examples shown by FIGS. 2-6B and described herein, each electroconductive section includes four notches. However, in alternate embodiments, one or more of the electroconductive sections may include a different number of notches (e.g., three, five, six, etc.). Additionally, in the examples described herein, each notch is positioned a same distance from each adjacent notch in the direction of the corresponding centerline (such as length 506 between notches 318 of first electroconductive section 314 being a same amount of length as length 508 between notches 328 of the second electroconductive section 316, for example). In alternate embodiments, one or more lengths between adjacent notches may be different than other lengths between adjacent notches. For example, at least one length between notches 318 of first electroconductive section 314 may be different than lengths between other adjacent notches 318 and/or lengths between notches 328 of the second electroconductive section 316.

As described above, the notches of the electroconductive sections reduces a temperature of the electroconductive sections during operation of the MRI system. FIGS. 6A-6B show relative temperatures at various regions of the electroconductive sections during operating conditions. Specifically, regions operating at a first temperature are indicated by a first stippled shading 600, regions operating at a second temperature lower than the first temperature are indicated by a second stippled shading 602, and regions operating at a third temperature lower than each of the first and second temperatures are indicted by a third stippled shading 604. Temperatures proximate to the centerline 324 of the first electroconductive section 314 (e.g., at region 606) are increased relative to temperatures proximate to the centerline 326 of the second electroconductive section 316 (e.g., at region 608). The reduced temperature of the region 608 of the second electroconductive section 316 relative to the region 606 of the first electroconductive section 314 is a result of the notches 328 extending across the centerline 326.

As described above, because the RF coil 206 includes an increased number of sections similar to second electroconductive section 316 relative to a number of sections similar to first electroconductive section 314, a temperature of the RF coil 206 is reduced during operation of the MRI system relative to RF coils that do not include this configuration. FIG. 7 illustrates a graph 700 showing a difference in operating temperatures of a standard RF coil that does not include notches extending across the centerlines of electroconductive sections relative to the RF coil 206 described herein. Specifically, plot 702 shows a temperature with respect to time of a bore of the MRI system (e.g., bore 200 shown by FIG. 2) coupled with a standard RF coil during conditions in which the MRI system is operated (e.g., to image a patient), and plot 704 shows a temperature with respect to time of the bore instead coupled with RF coil 206 during the same conditions. In one example, a peak temperature indicated by plot 702 may be 58 Celsius, and a peak temperature indicated by plot 704 may be 52 Celsius. By decreasing the temperature of the bore and the amount of vibrational noise resulting from operation of the MRI system via the RF coil 206, patient comfort may be increased.

FIGS. 2-6B show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

A technical effect of the disclosure is to reduce an amount and magnitude of eddy currents within the electroconductive sections of the RF coil via the plurality of notches extending toward the centerline of each electroconductive section. By reducing the amount of eddy currents, a temperature of the RF coil is reduced, and an amount of vibration of the RF coil is decreased. The reduced temperature and vibration results in a decreased temperature of the bore of the MRI system and decreases a level of acoustic noise within the bore, thereby increasing patient comfort. Another technical effect of the disclosure is to increase an electrical power efficiency of the RF coil. By reducing the eddy currents, a decreased amount of electrical energy is converted to thermal energy within the electroconductive sections of the RF coil, resulting in a more efficient generation of RF signals.

In one embodiment, a radio frequency (RF) coil for a medical imaging device comprises: a first electroconductive section having a first end and an opposing, second end; and a first plurality of notches of the first electroconductive section extending from the first end to the second end across a centerline of the first electroconductive section. In a first example of the RF coil, the RF coil further comprises: a second electroconductive section having a third end and an opposing, fourth end; a second plurality of notches formed at the third end, with each notch of the second plurality of notches extending toward the fourth end and not across a centerline of the second electroconductive section; and a third plurality of notches formed at the fourth end, with each notch of the third plurality of notches extending toward the third end and not across the centerline of the second electroconductive section. A second example of the RF coil optionally includes the first example, and further includes wherein the centerline of the first electroconductive section and the centerline of the second electroconductive section are positioned parallel to each other. A third example of the RF coil optionally includes one or both of the first and second examples, and further includes wherein the first electroconductive section is one of a first plurality of electroconductive sections positioned along a first circumferential surface of an end ring of the RF coil. A fourth example of the RF coil optionally includes one or more or each of the first through third examples, and further includes a second plurality of electroconductive sections positioned along a second circumferential surface of the end ring, the second circumferential surface opposed to the first circumferential surface in a radial direction of the end ring. A fifth example of the RF coil optionally includes one or more or each of the first through fourth examples, and further includes wherein the first plurality of electroconductive sections includes a second electroconductive section positioned adjacent to the first electroconductive section along the first circumferential surface, the second electroconductive section including a second plurality of notches and a third plurality of notches positioned opposite to each other across a centerline of the second electroconductive section. A sixth example of the RF coil optionally includes one or more or each of the first through fifth examples, and further includes wherein each electroconductive section of the second plurality of electroconductive sections has a same shape as the first electroconductive section. A seventh example of the RF coil optionally includes one or more or each of the first through sixth examples, and further includes wherein the first circumferential surface forms an outer perimeter of the end ring and the second circumferential surface forms an inner perimeter of the end ring. An eighth example of the RF coil optionally includes one or more or each of the first through seventh examples, and further includes wherein the first circumferential surface and second circumferential surface are each formed of a dielectric material, wherein each electroconductive section of the first plurality of electroconductive sections is directly bonded to the first circumferential surface, and wherein each electroconductive section of the second plurality of electroconductive sections is directly bonded to the second circumferential surface.

In another embodiment, a radio frequency (RF) coil for a medical imaging device comprises: a first plurality of electroconductive sections positioned along a first surface of a first end ring; and a plurality of notches formed by a first electroconductive section of the first plurality of electroconductive sections and extending across a centerline of the first electroconductive section. In a first example of the RF coil, the RF coil further comprises a second plurality of electroconductive sections positioned at the first surface, with each electroconductive section of the second plurality of electroconductive sections including a second plurality of notches that do not extend across a centerline of any of the electroconductive sections of the second plurality of electroconductive sections, and wherein each electroconductive section of the second plurality of electroconductive sections is positioned in an alternating arrangement with each electroconductive section of the first plurality of electroconductive sections. A second example of the RF coil optionally includes the first example, and further includes wherein the first end ring is one of a plurality of end rings of the RF coil. A third example of the RF coil optionally includes one or both of the first and second examples, and further includes wherein the plurality of end rings includes exactly the first end ring and a second end ring, with the first end ring and second end ring coupled together by a plurality of rungs. A fourth example of the RF coil optionally includes one or more or each of the first through third examples, and further includes a second plurality of electroconductive sections positioned along a second surface of first end ring, the second surface opposing first surface, and wherein each electroconductive section of the second plurality of electroconductive sections includes a second plurality of notches extending across a centerline of each electroconductive section of the second plurality of electroconductive sections. A fifth example of the RF coil optionally includes one or more or each of the first through fourth examples, and further includes wherein the first plurality of electroconductive sections includes a second, different electroconductive section, the second electroconductive section including a second plurality of notches that do not extend across a centerline of the second electroconductive section. A sixth example of the RF coil optionally includes one or more or each of the first through fifth examples, and further includes wherein the first electroconductive section and second electroconductive section are positioned adjacent to each other along the first surface.

In another embodiment, a radio frequency (RF) coil for a medical imaging device comprises: a first annular end ring coupled to a second annular end ring by a plurality of rungs, each of the first and second annular end rings including a first plurality of electroconductive sections; and a first plurality of notches formed by the first plurality of electroconductive sections and extending along an entire width of each section of the first plurality of electroconductive sections. In a first example of the RF coil, each rung of the plurality of rungs extends from the first annular end ring to the second annular end ring in a direction parallel to a central axis of the coil, and each notch of the first plurality of notches extends in a circumferential direction around the central axis. A second example of the RF coil optionally includes the first example, and further includes wherein the first plurality of electroconductive sections is positioned along a first perimeter and a second perimeter of each of the first and second annular end rings. A third example of the RF coil optionally includes one or both of the first and second examples, and further includes: a second plurality of electroconductive sections positioned along the first perimeter of each of the first and second end annular end rings, with each section of the first plurality of electroconductive sections positioned in alternating arrangement with each section of the second plurality of electroconductive sections; and a second plurality of notches formed by the second plurality of electroconductive sections and extending partially along an entire width of each section of the second plurality of electroconductive sections.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A radio frequency (RF) coil for a medical imaging device, comprising:
 a first electroconductive section having a first end and an opposing, second end;
 a first plurality of notches of the first electroconductive section extending from the first end to the second end across a centerline of the first electroconductive section;
 a second electroconductive section having a third end and an opposing, fourth end;
 a second plurality of notches of the second electroconductive section formed at the third end, with each notch of the second plurality of notches extending toward the fourth end and not across a centerline of the second electroconductive section; and
 a third plurality of notches of the second electroconductive section formed at the fourth end, with each notch of the third plurality of notches extending toward the third end and not across the centerline of the second electroconductive section.

2. The RF coil of claim 1, wherein the centerline of the first electroconductive section and the centerline of the second electroconductive section are positioned parallel to each other.

3. The RF coil of claim 1, wherein the first electroconductive section is one of a first plurality of electroconductive sections positioned along a first circumferential surface of an end ring of the RF coil.

4. The RF coil of claim 3, further comprising a second plurality of electroconductive sections positioned along a second circumferential surface of the end ring, the second circumferential surface opposed to the first circumferential surface in a radial direction of the end ring.

5. The RF coil of claim 4, wherein the first plurality of electroconductive sections includes the second electroconductive section positioned adjacent to the first electroconductive section along the first circumferential surface, the second plurality of notches and the third plurality of notches positioned opposite to each other across the centerline of the second electroconductive section.

6. The RF coil of claim 5, wherein each electroconductive section of the second plurality of electroconductive sections has a same shape as the first electroconductive section.

7. The RF coil of claim 6, wherein the first circumferential surface forms an outer perimeter of the end ring and the second circumferential surface forms an inner perimeter of the end ring.

8. The RF coil of claim 7, wherein the first circumferential surface and the second circumferential surface are each formed of a dielectric material, wherein each electroconductive section of the first plurality of electroconductive sections is directly bonded to the first circumferential surface, and wherein each electroconductive section of the second plurality of electroconductive sections is directly bonded to the second circumferential surface.

9. A radio frequency (RF) coil for a medical imaging device, comprising:
 a first plurality of electroconductive sections positioned along a first surface of a first end ring;
 a plurality of notches formed by a first electroconductive section of the first plurality of electroconductive sections and extending across a centerline of the first electroconductive section; and
 a second plurality of electroconductive sections positioned along a second surface of the first end ring, the second surface opposing the first surface, and wherein each electroconductive section of the second plurality of electroconductive sections includes a second plurality of notches extending across a centerline of each electroconductive section of the second plurality of electroconductive sections.

10. The RF coil of claim 9, wherein the second plurality of notches does not extend across a centerline of any of the electroconductive sections of the second plurality of electroconductive sections, and wherein each electroconductive section of the second plurality of electroconductive sections is positioned in an alternating arrangement with each electroconductive section of the first plurality of electroconductive sections.

11. The RF coil of claim 9, wherein the first end ring is one of a plurality of end rings of the RF coil.

12. The RF coil of claim 11, wherein the plurality of end rings includes exactly the first end ring and a second end ring, with the first end ring and the second end ring coupled together by a plurality of rungs.

13. The RF coil of claim 9, wherein the first plurality of electroconductive sections includes a second, different electroconductive section, the second plurality of notches that does not extend across a centerline of the second electroconductive section.

14. The RF coil of claim 13, wherein the first electroconductive section and the second electroconductive section are positioned adjacent to each other along the first surface.

15. A radio frequency (RF) coil for a medical imaging device, comprising:
- a first annular end ring coupled to a second annular end ring by a plurality of rungs, each of the first and second annular end rings including a first plurality of electroconductive sections;
- a first plurality of notches formed by the first plurality of electroconductive sections and extending along an entire width of each section of the first plurality of electroconductive sections;
- a second plurality of electroconductive sections positioned along a first perimeter of each of the first and second annular end rings, with each section of the first plurality of electroconductive sections positioned in alternating arrangement with each section of the second plurality of electroconductive sections; and
- a second plurality of notches formed by the second plurality of electroconductive sections and extending partially along an entire width of each section of the second plurality of electroconductive sections.

16. The RF coil of claim 15, wherein each rung of the plurality of rungs extends from the first annular end ring to the second annular end ring in a direction parallel to a central axis of the RF coil, and wherein each notch of the first plurality of notches extends in a circumferential direction around the central axis.

17. The RF coil of claim 16, wherein the first plurality of electroconductive sections is positioned along the first perimeter and a second perimeter of each of the first and second annular end rings.

* * * * *